United States Patent
Loh

(10) Patent No.: US 7,216,272 B2
(45) Date of Patent: May 8, 2007

(54) METHOD FOR REDUCING SRAM TEST TIME BY APPLYING POWER-UP STATE KNOWLEDGE

(75) Inventor: Wah Kit Loh, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 264 days.

(21) Appl. No.: 11/063,922

(22) Filed: Feb. 23, 2005

(65) Prior Publication Data

US 2006/0190778 A1 Aug. 24, 2006

(51) Int. Cl.
*G11C 29/00* (2006.01)

(52) U.S. Cl. ...................... 714/721; 714/719

(58) Field of Classification Search ............. 714/718, 714/721, 719; 713/1; 365/201, 185.09; 324/763

See application file for complete search history.

(56) References Cited

U.S. PATENT DOCUMENTS

| 5,289,475 | A | * | 2/1994 | Slemmer | 714/718 |
| 5,983,346 | A | * | 11/1999 | Wendell | 713/1 |
| 6,185,138 | B1 | * | 2/2001 | Brady | 365/201 |
| 6,556,479 | B2 | * | 4/2003 | Makuta et al. | 365/185.09 |
| 6,630,838 | B1 | * | 10/2003 | Wong | 324/763 |

* cited by examiner

Primary Examiner—David Ton
(74) Attorney, Agent, or Firm—Jacqueline J. Garner; W. James Brady, III; Frederick J. Telecky, Jr.

(57) ABSTRACT

Methods (400, 500, and 600) are disclosed for testing a memory device by tailoring an algorithm (460) used in the testing based on the preferred or intrinsic data state 425 that is obtained upon power-up of an advanced technology SRAM memory device (100). The methods (400, 500, and 600) take advantage of the observation that such SRAM devices repeatedly power-up in a preferred state 310. Accordingly, one method 500 comprises powering-up 510 the memory device and reading 520 a preferred power-up data state of each cell of the memory device without memory initialization or writes. The method 500 then captures and stores 530 a data state associated with the preferred power-up data state of each cell 100 and utilizes the stored power-up data state 310 or an inverse of the power-up data state 320 to tailor 540 a test pattern used by the test algorithm 460.

20 Claims, 5 Drawing Sheets

METHOD FOR REDUCING SRAM TEST TIME BY APPLYING POWER-UP STATE KNOWLEDGE

FIELD OF INVENTION

The present invention relates generally to semiconductor processing, and more particularly to testing a memory in a manner that reduces testing time, particularly when utilized in static random access memory (SRAM).

BACKGROUND OF THE INVENTION

Memory test algorithms are written to uncover faults with storage cells and the access to these storage cells arising from improper design, lack of design margins or processing deficiencies. Generally, these algorithms are written to be extensive and exhaustive to ensure that no bit defects, either hard defects or intermittent failures find their way into the field. As such, in addition to straight forward writing and reading from storage cells, various methods of disturbing the bits have been devised and employed. Some algorithms write and read at one voltage and read and write at another voltage to check for slew margins.

Data retention tests are also being performed with more frequency lately as memory cells are required to retain data in a sleep mode or what is commonly referred to as "data retention" mode. In this mode, storage cells have reduced voltages applied across them to minimize leakage currents during the standby condition. As more and more tests are applied and as memory sizes grow in embedded memory applications, memory test times have been a substantial part of the overall test time on products despite the use of design for test (DFT) and built-in self test (BIST). Accordingly, there is a growing need for the reduction of the overall testing time in the manufacturing and testing of semiconductor memory devices.

Several other trends presently exist in the semiconductor and electronics industry. Devices are continually being made smaller, faster and requiring less power. Accordingly, in the semiconductor industry there is a continuing trend toward manufacturing integrated circuits (ICs) with higher densities. To achieve high densities, there has been and continues to be efforts toward scaling down dimensions (e.g., at submicron levels) on semiconductor wafers, that are generally produced from bulk silicon. In order to accomplish such high densities, smaller feature sizes, smaller separations between features, and more precise feature shapes are required in integrated circuits fabricated on small rectangular portions of the wafer, commonly known as dies. This may include the width and spacing of interconnecting lines, spacing and diameter of contact holes, as well as the surface geometry of various other features (e.g., corners and edges).

It can be appreciated that the effects of scaling may be even more noticeable in certain types of semiconductor devices, such as static random access memory (SRAM), for example, which incorporate multiple densely packed transistors that require matched electrical properties. As semiconductor features are aggressively reduced, for example, local mismatches between SRAM transistors have increased; presenting greater problems that may limit the usable feature size. Additionally, small misalignments between any two layers (e.g., moat and gate) have resulted in larger mismatches for more advanced technology nodes. For example, in situations where there is misalignment, a right transistor Vt may be altered more or less than a left transistor Vt, thereby disadvantageously creating transistor mismatch.

Semiconductor memories can, for example, be characterized as volatile memories (e.g., RAMs) or nonvolatile memories, where RAMs can either be static (SRAM) or dynamic (DRAM) differing mainly in the manner by which they store a state of a bit. In SRAM, for example, each memory cell includes transistor-based circuitry that implements a bistable latch, which relies on transistor gain and positive (e.g., reinforcing) feedback so that it can only assume one of two possible states, namely on (state 1) or off (state 2). The latch can be programmed or induced to change from one state to the other through the application of a voltage or other external stimuli. This arrangement is desirable for a memory cell since a state written to the cell will be retained until the cell is reprogrammed.

DRAMs on the other hand implement a capacitor that is either charged or discharged to store the on (state 1) or off (state 2) state of a cell. Capacitors discharge over time, however, and DRAMs must therefore be periodically 'refreshed'. Also, a bistable latch can generally be switched between states much faster than the amount of time it takes to charge or discharge a capacitor. Accordingly, SRAMs are a desirable type of memory for certain types of applications.

SRAM is typically arranged as a matrix of memory cells fabricated in an integrated circuit chip, and address decoding in the chip allows access to each cell for read/write functions. SRAM memory cells use active feedback from cross-coupled inverters in the form of a latch to store or "latch" a bit of information. These SRAM memory cells are often arranged in rows so that blocks of data such as words or bytes can be written or read simultaneously. Standard SRAM memory cells have many variations. The basic CMOS SRAM cell generally includes two n-type (nMOS) pull-down or drive transistors and two p-type (pMOS) load transistors in a cross-coupled inverter configuration, with two additional nMOS select transistors added to make up a six-transistor cell (a 6T cell). Additionally, application specific SRAM cells can include an even greater number of transistors. Since a plurality of transistors are utilized in SRAM requiring matched electrical characteristics, and since the negative effects of matching may become more prevalent as transistor widths are reduced, transistor mismatching issues may present themselves to a great degree in SRAM, particularly as that type of memory is continually scaled down.

Accordingly, it would be desirable to obtain a testing technique that reduces memory testing time while allowing transistors to be scaled down, particularly in SRAM devices.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

The present invention is directed to a test method and the tailoring of a testing algorithm used in the testing of SRAM memory devices. The method utilizes the realization that such SRAM devices repeatedly power-up in a preferred state, particularly in SRAM of advanced technology nodes, where transistor matching and misalignment issues are more prevalent. Thus, the method of the present invention exploits this scaling behavior of SRAM devices.

In one aspect of the present invention the method comprises powering-up the memory device and reading a preferred (or intrinsic) power-up data state of each cell of the memory device without memory initialization or writes. The method then captures and stores the data state of each cell and utilizes the stored power-up data states or an inverse of the power-up data states to tailor a test pattern used by the test algorithm for further memory testing. Thus, additional reading of the memory cell in the preferred data state is unnecessary, permitting reduced testing times, particularly in the case of data retention and cell disturb testing times.

In another aspect of the present invention, the test pattern data (e.g., 0 and 1 data, a checkerboard test, or a characterization pattern) used in various conventional testing algorithms of an SRAM device (e.g., a 6T SRAM) may be replaced by the stored power-up data states or an inverse of the power-up data states. In this way prior knowledge of the individual bit behavior at power-up is preserved to mitigate subsequent testing time.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

DETAILED DESCRIPTION OF THE INVENTION

Figure 1:
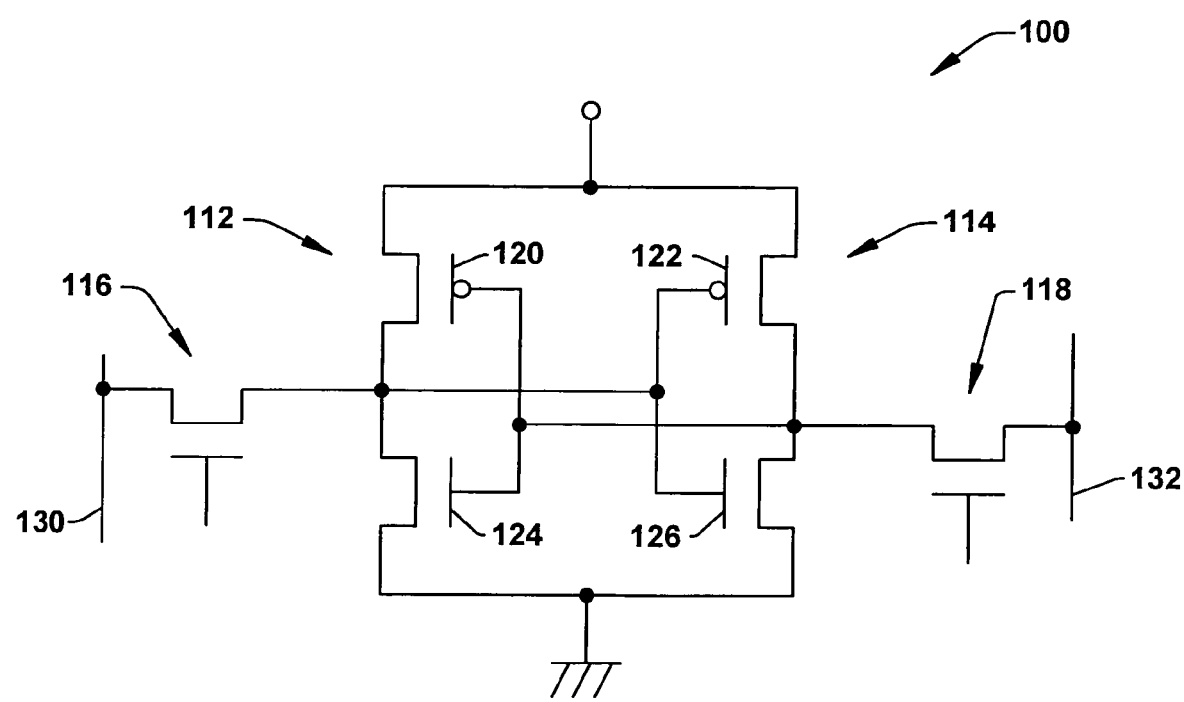
FIG. 1 is a schematic diagram of a conventional 6T static random access memory (SRAM) cell.

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. In other instances, known structures and devices are shown in block diagram form in order to facilitate describing one or more aspects of the present invention.

The present invention pertains to a method of tailoring a test algorithm used in the testing of SRAM memory devices utilizing the preferred power-up data state of each memory cell.

Conventional test algorithms in use today are written without contemplating prior knowledge of individual bit behavior. The method of the present invention determines the natural states of a RAM after initial power-up, providing information that can then be used to adapt test algorithms and reduce the number of memory test cycles while maintaining the same confidence in memory operations. After the initial overhead of storing the power-up data states of the cells, test times may be halved, because subsequent checking of the power-up states is avoided. In algorithms requiring long test times, for example, as with data retention tests, in which the arrays are held inactive for as long as a half second, savings can be substantial. The method is applicable to many of the algorithms utilized in memory testing, once the basic ability to write to the storage cell its intrinsic stable state is verified.

Two enabling factors have emerged over recent years allowing intelligence to be incorporated into test algorithms for test time reduction. Inexpensive test equipment hardware allows the capture and storage of memory bit states for the entire memory of the chip under test at any point in time. Further, as indicated above, in recent technology nodes, it has been observed that memory bits, and SRAM in particular, reliably power-up in a preferred state. As previously discussed, one reason for this is that local mismatches of SRAM transistors have increased as their sizes have trended lower for well aligned transistors. Additionally, small misalignments between any two layers (e.g., moat and gate) have resulted in larger mismatches for more advanced technology nodes. The method of the present invention will become more apparent in association with the discussion of the following figures.

FIG. 1 illustrates the schematic diagram for an exemplary SRAM circuit 100 such as may be used in association with the present invention, and wherein several aspects of the invention are presented.

FIG. 1, for example, illustrates a typical static random access memory (SRAM) cell 100 generally comprising a pair of cross-coupled inverters 112, 114 to store a data bit state and a pair of pass transistors 116, 118 to read and write a data bit between the cross-coupled inverters 112, 114 and bitlines 130, 132. Respective inverters 112, 114 comprise a p-type MOS (pMOS) pull-up or load transistor 120, 122 and an n-type (nMOS) pull-down transistor 124, 126. Transistors 116, 118 are generally n-type as well. This type of SRAM cell comprises six transistors and is termed a 6T full CMOS SRAM cell. When the channels of all the transistors are formed in the single crystal silicon substrate, it is called a single crystalline bulk CMOS 6T SRAM cell. It is also referred to as a planar SRAM cell when all the transistors are made in the same substrate material (e.g., bulk crystalline silicon, SOI, etc.).

In general, SRAM cells are more stable and have better data retention where the respective pMOS (120, 122) and nMOS (124, 126) transistors are matched for the two inverters (112, 114). However, as dimensions are reduced to scale down devices, misalignments and mismatching between transistors becomes a strong factor affecting the state that the SRAM device will prefer or favor upon power-up.

Figure 2:
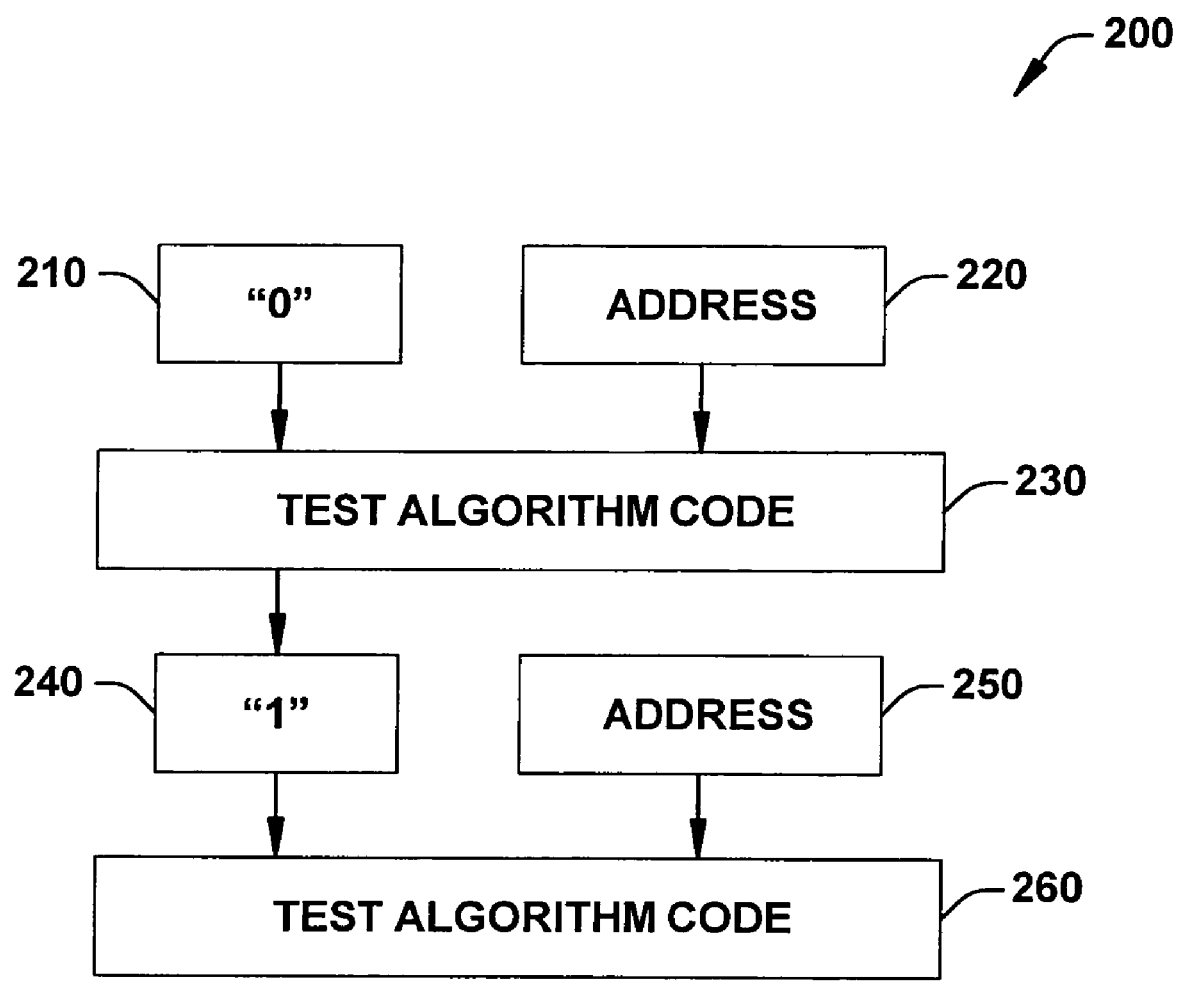
FIG. 2 is a basic flow diagram illustrating a conventional testing program flow for testing the SRAM cell 100 of FIG. 1, or an array of such cells of an SRAM memory device.

FIG. 2 illustrates a conventional testing program flow 200 for testing an SRAM memory device such as an array of memory cells similar to that of cell 100 of FIG. 1. In the conventional testing program 200, for example, a "0" state 210 may be initially written into each cell address 220 of the SRAM memory device. A memory test is then performed according to this code written into a test algorithm 230, with the knowledge that each bit should now indicate a "0" state. Similarly, a "1" state 240 may then be written into each cell address 250 of the SRAM memory device. Another memory test is then performed according to this code written into a test algorithm 260, with the knowledge that each bit should now indicate a "1" state. In the conventional testing method, however, no prior knowledge of the bit behavior is taken into account or utilized. Accordingly, testing times are long in such conventional testing methods. Conversely, a goal of the present invention is to demonstrate that such prior knowledge can significantly save testing time.

Figure 3:
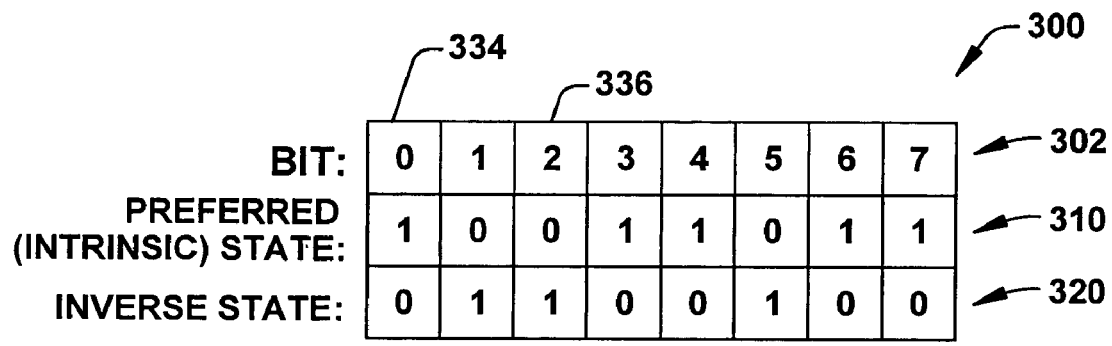
FIG. 3 is a chart illustrating the bits of an exemplary eight-bit word of the preferred bit states and associated inverse bits states that may be obtained upon power-up of an SRAM device such as may be used in accordance with the present invention.

FIG. 3, for example, illustrates the bits of an exemplary eight-bit word 300 comprising eight SRAM cells or bits 302 of an SRAM device such as may be used in accordance with the present invention. Bits 302 (e.g., bits 0–7), in one example, naturally power-up to their intrinsic or preferred bit states 310, as shown, having associated inverse bits states 320. For example, bit(0) 334, prefers a "1" state on power-up, while bit(2) 336, prefers a "0" state on power-up, perhaps because of specific mismatching or misalignment characteristics of the transistors used in these SRAM cells.

The inventors of the present invention have realized that this prior information of the cells 302 can now be captured and stored by the memory tester for later testing reference. For example, in subsequent memory testing, since it is now known what states these cells prefer, test program algorithms may be written such that data and inverse data (e.g., 0 and 1) patterns (e.g., 210 and 240 of FIG. 2), may be replaced by just the inverse of the power-up states of the bit under test. This is because it is now known that the preferred state is the more stable state, and therefore the inverse state is now the state that is in greatest need of verification in subsequent memory tests. As previously mentioned, SRAM that incorporates 'mis-matched' transistors can be adversely affected by operating characteristics that vary from transistor to transistor. For example, such SRAM may be unstable and not retain the desired bit state (e.g., a logic 1 instead of a logic 0 or vice versa).

Figure 4:
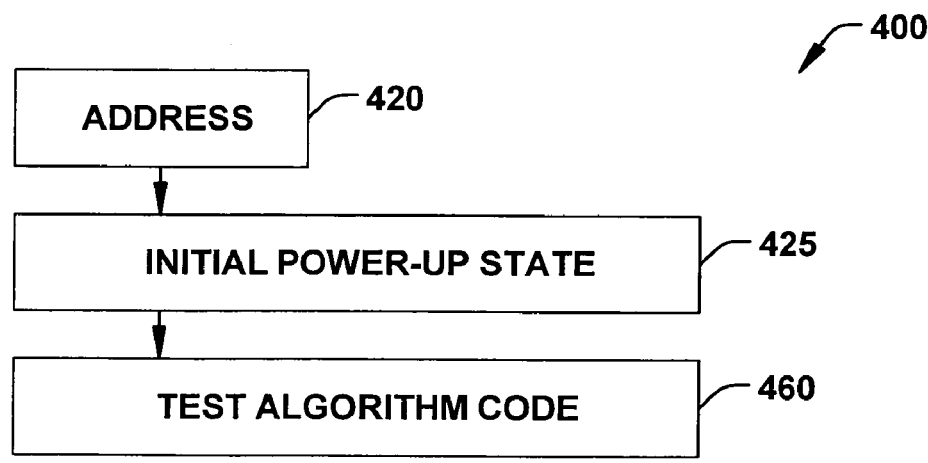
FIG. 4 is a simplified flow diagram illustrating a proposed testing program flow used in accordance with the present invention for an SRAM memory device.
Figure 5:
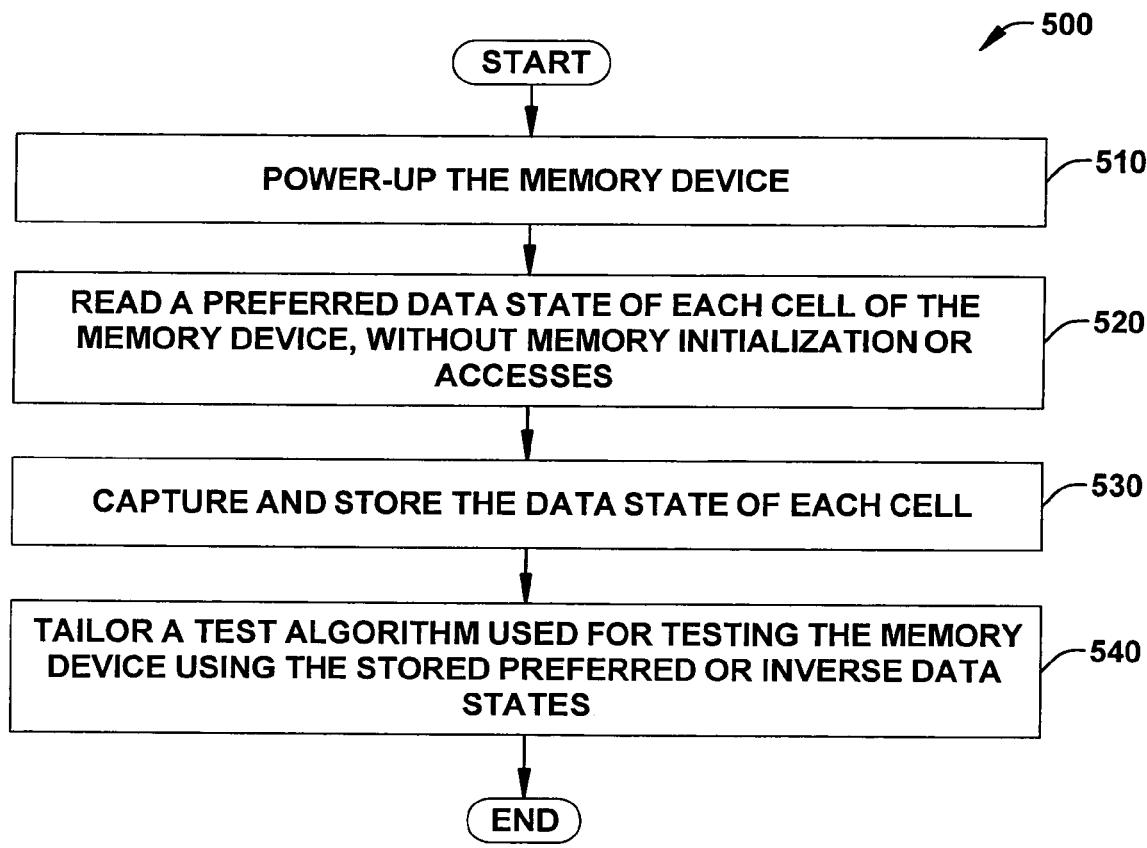
FIG. 5 is a flow diagram illustrating an exemplary method for testing an SRAM memory device, utilizing the preferred or inverse of the power-up data states of the cells according to one or more aspects of the present invention.
Figure 6:
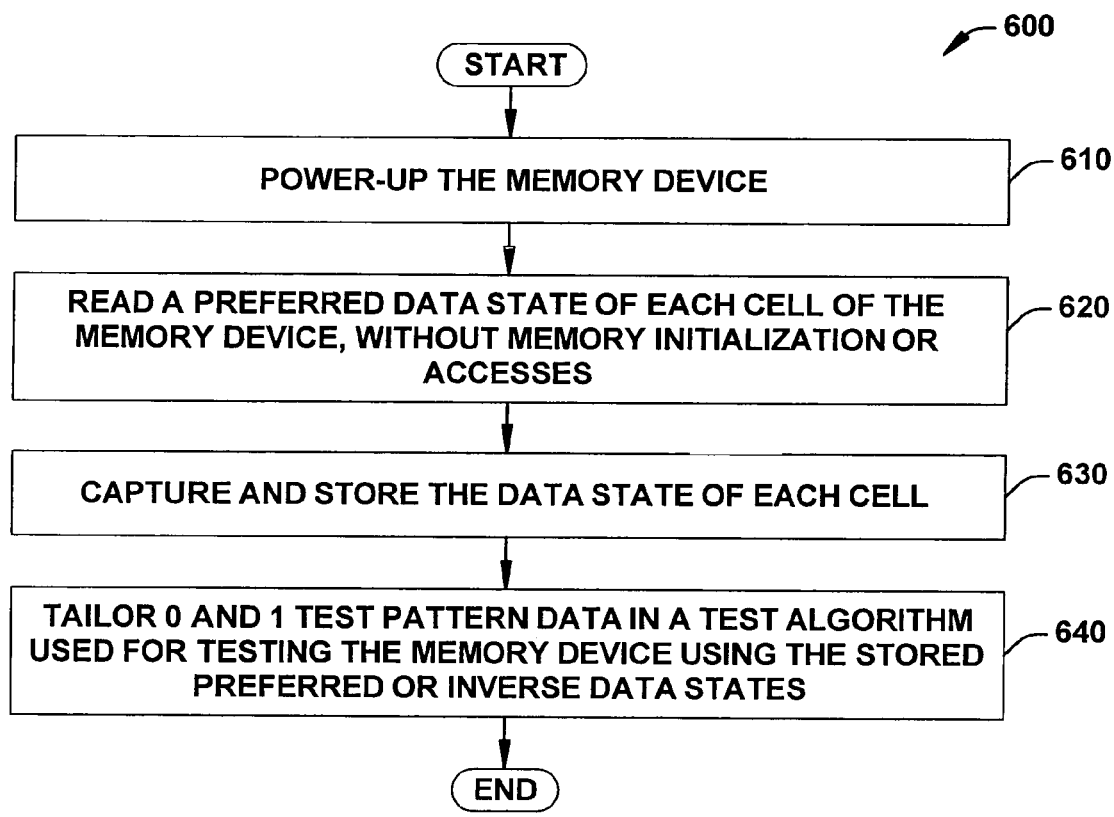
FIG. 6 is a flow diagram illustrating an exemplary method for tailoring a test algorithm used in the testing of an SRAM memory device, utilizing the preferred or inverse of the power-up data states of the cells according to one or more aspects of the present invention.

FIGS. 4, 5 and 6 illustrate flow diagrams of exemplary methods 400, 500 and 600, respectively, for testing SRAM memory devices and tailoring test algorithms used in association with the present invention, and wherein several aspects of the invention are presented. Methods 400, 500 and 600 utilize prior knowledge of the power-up state of memory cells to tailor testing algorithms to minimize testing times where advanced technology SRAM memory devices having densely packed and/or matched transistors are employed. While the methods 400, 500 and 600 are illustrated and described below as a series of acts or events, it will be appreciated that the present invention is not limited by the illustrated ordering of such acts or events. For example, some acts may occur in different orders and/or concurrently with other acts or events apart from those illustrated and/or described herein. In addition, not all illustrated steps may be required to implement a methodology in accordance with one or more aspects of the present invention. Further, one or more of the acts depicted herein may be carried out in one or more separate acts or phases. Additionally, while the discussion herein is with made within reference to SRAM, it is to be appreciated that one or more aspects of the present invention may have application to different types of memories and/or to other structures or circuits not illustrated or described herein.

FIG. 4, for example, illustrates a simplified testing program flow 400 used in accordance with the method of the present invention for testing an SRAM memory device such as an array of memory cells similar to that of cell 100 of FIG. 1. In the testing program 400, upon power-up, and without doing a memory initialization or write, a read operation is performed on all cell addresses 420 of the SRAM memory device. At 425 the preferred power-up data state of each memory cell is captured and the inverse of the power-up data state is stored, for example, in the tester memory. A memory test is then performed using these stored data states written into a test algorithm 460, with the knowledge that each bit should now indicate the inverse of the power-up data state.

Thus, once this initial overhead of storing the power-up data states is achieved, that subsequent testing time is reduced, because additional checking of the power-up states are avoided. Bit addresses to be written to and accessed are known before hand and accordingly, retrieval of the power-up state can be accomplished using a captured data state table for each chip under test. Note herein, that references to power-up data states may represent the preferred or the inverse of the power-up data states. For example, some test algorithms may benefit from the preferred power-up data state, while others from the inverse of the power-up data states.

Some examples of test algorithms used in production testing and characterization of memory chips include data retention tests, "Write Immediate", "Write Immediate with Data increment", "Checker Board Disturb", "Inverse Checker Board Disturb", various other characterization patterns, and other cell disturb tests. Each of these algorithms may require data and inverse data to be checked along with address increment and decrement sequencing and row and column fast testing.

FIG. 5 illustrates a flow diagram illustrating an exemplary method 500 for testing an SRAM memory device, utilizing the preferred or inverse of the power-up data states of the cells according to one or more aspects of the present invention. Initially at 510, power is applied to the memory device, for example, an SRAM memory device comprising memory cells 100 of FIG. 1. Without doing a memory initialization or write, a read operation is then performed at 520 on each cell address (e.g., 420 of FIG. 4) of the SRAM memory device. At 530 the preferred power-up data state of each memory cell is captured and either the preferred or the inverse of the power-up data state is stored, for example, in the tester memory.

A test algorithm that is to be used for testing the memory is then tailored by writing these stored data states into the test algorithm at 540. Subsequently, memory testing may then be performed using the tailored algorithm from 540, testing with the knowledge that each bit should now indicate the stored power-up data state (e.g., either the preferred or the inverse of the power-up data state).

FIG. 6 illustrates a flow diagram illustrating an exemplary method 600 for tailoring a test algorithm used in the testing of an SRAM memory device, utilizing the preferred or inverse of the power-up data states of the cells according to one or more aspects of the present invention. Method 600 of FIG. 6 proceeds similarly, wherein initially at 610, power is applied to the memory device, for example, an SRAM memory device comprising memory cells 100 of FIG. 1. Without doing a memory initialization or write, a read operation is then performed at 620 on each cell address (e.g., 420 of FIG. 4) of the SRAM memory device. At 630 the preferred power-up data state of each memory cell is captured and either the preferred or the inverse of the power-up data state is stored, for example, in the tester memory.

Test pattern data (e.g., specific 0 and 1 pattern data) of an algorithm that is to be used for testing the memory is then tailored by writing these stored data states into the test algorithm at 640. Subsequently, memory testing may then be performed using the tailored algorithm from 640, testing with the knowledge that each bit should now indicate the stored power-up data state (e.g., either the preferred or the inverse of the power-up data state).

As indicated previously, such subsequent memory testing provides substantial savings of testing time (e.g., about 20–50% savings on some tests) while ensuring adequate memory fault detection. Thus, by avoiding the need to test known stable states of memory cells, more efficient and smarter test algorithms are achieved using the methods of the present invention.

In addition, the methods of the present invention find application in SRAM memory devices, for example, 6T SRAM devices, and other such memory devices where a preferred stable state is reliably achieved upon power-up.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In addition, while a particular feature or aspect of the invention may have been disclosed with respect to only one of several implementations, such feature or aspect may be combined with one or more other features or aspects of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising." Also, the term "exemplary" is merely meant to mean an example, rather than the best. It is also to be appreciated that layers and/or elements depicted herein are illustrated with particular dimensions relative to one another (e.g., layer to layer dimensions and/or orientations) for purposes of simplicity and ease of understanding, and that actual dimensions of the elements may differ substantially from that illustrated herein.

What is claimed is:

1. A method of testing a memory device, comprising:
    reading a preferred power-up data state of each cell of the memory device;
    capturing and storing a data state associated with the preferred power-up data state of each cell of the device; and
    tailoring a test algorithm used for testing the memory device based on the stored data states of the memory.

2. The method of claim 1, further comprising testing the memory device using the tailored test algorithm, thereby eliminating the need to re-read the preferred data state of the cells to reduce testing times.

3. The method of claim 1, further comprising testing the memory device two or more times using the stored data states and the tailored test algorithm, thereby eliminating the need to re-read the preferred data state of the cells to reduce testing times.

4. The method of claim 1, wherein the tailoring of the test algorithm comprises replacing specific 0 and 1 test pattern data in the algorithm with one of the power-up data states and an inverse of the power-up data states.

5. The method of claim 1, wherein the memory device comprises an SRAM memory device.

6. The method of claim 5, wherein the SRAM device comprises a 6T SRAM.

7. The method of claim 1, wherein the test algorithm comprises one of a data retention test and a cell disturb test.

8. The method of claim 1, wherein the test algorithm comprises one of a checkerboard test, an inverse checkerboard test, a checkerboard disturb test, and a characterization pattern.

9. The method of claim 1, wherein the data state associated with the preferred power-up data state of each cell of the memory device is stored in a tester memory.

10. The method of claim 1, further comprising testing the memory device using the tailored test algorithm, thereby eliminating the need to re-read the preferred data state of each cell to reduce testing times.

11. The method of claim 1, wherein the memory device comprises an SRAM memory device.

12. A method of tailoring an algorithm used for testing a memory device, comprising:
    reading a preferred power-up data state of each cell of the memory device;
    capturing and storing a data state associated with the preferred power-up data state of each cell of the device; and
    tailoring test pattern data in the algorithm using one of a power-up data state and an inverse of the power-up data state, thereby tailoring the algorithm.

13. The method of claim 12, further comprising testing the memory device using the tailored test algorithm, thereby eliminating the need to re-read the preferred data state of each cell to reduce testing times.

14. The method of claim 12, further comprising testing the memory device two or more times using the stored data state and the tailored test algorithm, thereby eliminating the need to re-read the preferred data state of each cell to reduce testing times.

15. The method of claim 12, wherein the memory device comprises an SRAM memory device.

16. The method of claim 15, wherein the SRAM device comprises a 6T SRAM.

17. The method of claim 12, wherein the test algorithm comprises one of a data retention test and a cell disturb test.

18. The method of claim 12, wherein the test algorithm comprises one of a checkerboard test, an inverse checkerboard test, a checkerboard disturb test, and a characterization pattern.

19. The method of claim 12, wherein the data state of each cell of the memory device is stored in a tester memory.

20. A method of tailoring an algorithm used for testing a memory device, comprising:
    reading a preferred power-up data state of each cell of the memory device;
    capturing and storing the data state associated with the preferred power-up data state of each cell of the device; and
    replacing specific 0 and 1 test pattern data in the algorithm with one of the power-up data state and an inverse of the power-up data state, thereby tailoring the algorithm.

* * * * *